United States Patent
Zhu

(10) Patent No.: US 8,054,677 B2
(45) Date of Patent: Nov. 8, 2011

(54) MAGNETIC MEMORY WITH STRAIN-ASSISTED EXCHANGE COUPLING SWITCH

(75) Inventor: Jianxin Zhu, Eagan, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 493 days.

(21) Appl. No.: 12/248,237

(22) Filed: Oct. 9, 2008

(65) Prior Publication Data
US 2010/0032738 A1 Feb. 11, 2010

Related U.S. Application Data

(60) Provisional application No. 61/086,873, filed on Aug. 7, 2008.

(51) Int. Cl.
*G11C 11/00* (2006.01)
(52) U.S. Cl. ............. 365/158; 365/185.03; 257/421
(58) Field of Classification Search .......... 365/158, 365/185.03, 421; 257/421
See application file for complete search history.

(56) References Cited

U.S. PATENT DOCUMENTS

| | | | |
|---|---|---|---|
| 5,461,526 A | 10/1995 | Hamakawa | |
| 5,841,692 A | 11/1998 | Gallagher | |
| 5,963,472 A | 10/1999 | Inada | |
| 6,146,775 A * | 11/2000 | Fujita et al. | 428/811.2 |
| 6,166,948 A | 12/2000 | Parkin | |
| 6,183,859 B1 | 2/2001 | Chen | |
| 6,185,080 B1 * | 2/2001 | Gill | 360/324.2 |
| 6,522,573 B2 | 2/2003 | Saito | |
| 6,597,618 B2 | 7/2003 | Zheng | |
| 6,605,772 B2 | 8/2003 | Harman | |
| 6,633,498 B1 | 10/2003 | Engel | |
| 6,714,444 B2 | 3/2004 | Huai | |
| 6,771,534 B2 | 8/2004 | Stipe | |
| 6,781,874 B2 | 8/2004 | Hidaka | |
| 6,791,865 B2 | 9/2004 | Tran | |
| 6,819,586 B1 | 11/2004 | Anthony | |
| 6,829,161 B2 | 12/2004 | Huai | |
| 6,838,740 B2 | 1/2005 | Huai | |
| 6,845,038 B1 | 1/2005 | Shukh | |
| 6,847,547 B2 | 1/2005 | Albert | |
| 6,888,742 B1 | 5/2005 | Nguyen | |

(Continued)

FOREIGN PATENT DOCUMENTS

WO WO 2008/154519 12/2008

OTHER PUBLICATIONS

Berger, L., Emission of Spin waves by a magnetic multilayer traversed by a current, Physical Review B, Oct. 1, 1996, pp. 9353-9358, vol. 54, No. 13, The American Physical Society, USA.

(Continued)

*Primary Examiner* — Connie Yoha
(74) *Attorney, Agent, or Firm* — Campbell Nelson Whipps LLC

(57) ABSTRACT

A magnetic tunnel junction cell having a free layer and first pinned layer with perpendicular anisotropy, the cell including a coupling layer between the free layer and a second pinned layer, the coupling layer comprising a phase change material switchable from an antiferromagnetic state to a ferromagnetic state. In some embodiments, at least one actuator electrode proximate the coupling layer transfers a strain from the electrode to the coupling layer to switch the coupling layer from the antiferromagnetic state to the ferromagnetic state. Memory devices and methods are also described.

24 Claims, 4 Drawing Sheets

U.S. PATENT DOCUMENTS

| | | |
|---|---|---|
| 6,903,400 B2 | 6/2005 | Kikuchi |
| 6,933,155 B2 | 8/2005 | Albert |
| 6,950,335 B2 | 9/2005 | Dieny |
| 6,958,927 B1 | 10/2005 | Nguyen |
| 6,963,098 B2 | 11/2005 | Daughton |
| 6,967,863 B2 | 11/2005 | Huai |
| 6,980,464 B2 | 12/2005 | Fukuzumi |
| 6,980,469 B2 | 12/2005 | Kent |
| 6,985,385 B2 | 1/2006 | Nguyen |
| 7,006,336 B2 | 2/2006 | Coffey |
| 7,020,009 B2 | 3/2006 | Ho |
| 7,031,178 B2 | 4/2006 | Parkin |
| 7,057,921 B2 | 6/2006 | Valet |
| 7,088,609 B2 | 8/2006 | Valet |
| 7,098,494 B2 | 8/2006 | Pakala |
| 7,110,287 B2 | 9/2006 | Huai |
| 7,126,202 B2 | 10/2006 | Huai |
| 7,160,770 B2 | 1/2007 | Sasaki |
| 7,161,829 B2 | 1/2007 | Huai |
| 7,170,778 B2 | 1/2007 | Kent |
| 7,180,113 B2 | 2/2007 | Braun |
| 7,180,770 B2 | 2/2007 | Perner |
| 7,187,577 B1 | 3/2007 | Wang |
| 7,190,611 B2 | 3/2007 | Nguyen |
| 7,205,564 B2 | 4/2007 | Kajiyama |
| 7,224,601 B2 | 5/2007 | Panchula |
| 7,227,773 B1 | 6/2007 | Nguyen |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,242,045 B2 | 7/2007 | Nguyen |
| 7,242,048 B2 | 7/2007 | Huai |
| 7,245,462 B2 | 7/2007 | Huai |
| 7,252,852 B1 | 8/2007 | Parkin |
| 7,272,034 B1 | 9/2007 | Chen |
| 7,272,035 B1 | 9/2007 | Chen |
| 7,274,057 B2 | 9/2007 | Worledge |
| 7,277,259 B2 * | 10/2007 | Yamamoto et al. ........ 360/294.4 |
| 7,286,395 B2 | 10/2007 | Chen |
| 7,289,356 B2 | 10/2007 | Diao |
| 7,307,876 B2 | 12/2007 | Kent |
| 7,310,265 B2 | 12/2007 | Zheng |
| 7,339,817 B2 | 3/2008 | Nickel |
| 7,342,169 B2 | 3/2008 | Venkatasubramanian |
| 7,345,911 B2 | 3/2008 | Min |
| 7,345,912 B2 | 3/2008 | Luo |
| 7,349,243 B2 | 3/2008 | Lin |
| 7,369,427 B2 | 5/2008 | Diao |
| 7,372,116 B2 | 5/2008 | Fullerton |
| 7,379,327 B2 | 5/2008 | Chen |
| 7,411,817 B2 | 8/2008 | Nozieres |
| 7,430,135 B2 | 9/2008 | Huai |
| 7,453,720 B2 | 11/2008 | Ju |
| 7,479,193 B1 | 1/2009 | Clark |
| 7,486,545 B2 | 2/2009 | Min |
| 7,486,551 B1 | 2/2009 | Li |
| 7,486,552 B2 | 2/2009 | Apalkov |
| 7,489,541 B2 | 2/2009 | Pakala |
| 7,502,249 B1 | 3/2009 | Ding |
| 7,508,702 B2 | 3/2009 | Ho |
| 7,515,457 B2 | 4/2009 | Chen |
| 7,518,835 B2 | 4/2009 | Huai |
| 7,525,862 B1 | 4/2009 | Sun |
| 7,576,956 B2 | 8/2009 | Huai |
| 7,660,151 B2 | 2/2010 | Leuscher |
| 7,800,095 B2 | 9/2010 | An |
| 7,804,709 B2 | 9/2010 | Wang |
| 7,821,086 B2 * | 10/2010 | Kajiyama ................ 257/421 |
| 2002/0186582 A1 | 12/2002 | Sharma |
| 2004/0084702 A1 | 5/2004 | Jeong |
| 2005/0018475 A1 | 1/2005 | Tran |
| 2005/0104146 A1 | 5/2005 | Nickel |
| 2005/0150535 A1 | 7/2005 | Samavedam |
| 2005/0150537 A1 | 7/2005 | Ghoshal |
| 2005/0213375 A1 | 9/2005 | Perner |
| 2006/0215444 A1 | 9/2006 | Perner |
| 2007/0034919 A1 | 2/2007 | Wang |
| 2007/0085068 A1 | 4/2007 | Apalkov |
| 2007/0176251 A1 | 8/2007 | Oh |
| 2007/0258281 A1 | 11/2007 | Ito |
| 2008/0019040 A1 | 1/2008 | Zhu |
| 2008/0037179 A1 | 2/2008 | Ito |
| 2008/0055792 A1 | 3/2008 | Zheng |
| 2008/0112094 A1 | 5/2008 | Kent |
| 2008/0137224 A1 | 6/2008 | Gao |
| 2008/0154519 A1 | 6/2008 | Zhou |
| 2008/0186758 A1 | 8/2008 | Shen |
| 2008/0225584 A1 | 9/2008 | Gao |
| 2008/0273380 A1 | 11/2008 | Diao |
| 2008/0291720 A1 | 11/2008 | Wang |
| 2008/0291721 A1 | 11/2008 | Apalkov |
| 2008/0310213 A1 | 12/2008 | Chen |
| 2008/0310219 A1 | 12/2008 | Chen |
| 2009/0010040 A1 | 1/2009 | Takase |
| 2009/0040855 A1 | 2/2009 | Luo |
| 2009/0050991 A1 | 2/2009 | Nagai |
| 2009/0073750 A1 | 3/2009 | Leuschner |
| 2009/0185410 A1 | 7/2009 | Huai |
| 2009/0302403 A1 | 12/2009 | Nguyen |
| 2010/0034008 A1 | 2/2010 | Wang |

OTHER PUBLICATIONS

Florez, S.H. et al., Modification of Critical Spin Torque Current Induced by rf Excitation, Journal of Applied Physics, 103, 07a708 (2008).

Han et al., Current-Induced Butterfly Shaped Domains and Magnetization Switching in Magnetic Tunnel Junctions, Science and Technology of Advanced Materials 6 (2005) 784-788.

Hosomi et al., A Novel Nonvolatile Memory with Spin Torque Transfer Magnetization Switching: Spin-RAM, 2005 IEEE.

Johnson, M.T., et al., Magnetic anisotropy in metallic multilayers, Rep. Prog. Phys., 1996, pp. 1409-1458, vol. 59, IOP Publishing Ltd., UK.

Kawahara et al., 2Mb Spin-Transfer Torque RAM (SPRAM) with Bit-by-bit Bidirectional Current Write and Parallelizing Direction Current Read, ISSC 2007/Session 26/Non-Volatile Memories/26.5.

Kim, Chris H., et al. Dynamic Vt SRAM: A Leakage Tolerant Cache Memory for Low Voltage Microprocessors, ISLPED '02, Aug. 2002, pp. 251-254, US.

Meng et al., Spin Transfer in Nanomagnetic Devices with Perpendicular Anistropy, Applied Physics Letters 88, 172506 (2006).

Ozatay et al., "Sidewall oxide effects on spin-torque- and magnetic-field-induced reversal characteristics of thin-film nanomagnets", Nature Materials, vol. 7, pp. 567-573 (Jul. 2008).

Prejbeanu et al., "Thermally Assisted MRAM", J. Phys. Condens. Matter 19 (2007) 165218 (23 pp).

Rivkin, K. et al., Magnetization Reversal in the Anisotropy-Dominated Regine Using Time-Dependent Magnetic Fileds, Applied Physics Letters 89, 252507 (2006).

Seki et al., Spin-Polarized Current-Induced Magnetization Reversal in Perpendicularly Magnetized L10-FePt Layers, Applied Physics Letters 88, 172504 (2006).

Slonczewski et al., Conductance and Exchange Coupling of Two Ferromagnets Separated by a Tunneling Barrier, 1989 the American Physical Society, Physical Review B, vol. 39, No. 10, Apr. 1, 1989.

Slonczewski et al., Current-Driven Excitation of Magnetic Multilayers, Journal of Magnetism and Magnetic Materials 159 (1996) L1-L7.

Sun, Spin-Current Interaction with Monodomain Magnetic Body: A Model Study, Physical Review B, vol. 62, No. 1, Jul. 2000.

Yagami, Kojiro, et al., Inspection of Intrinsic Critical Currents for Spin-Transfer Magnetization Switching, IEEE Transactions on Magnetics, Oct. 2005, pp. 2615-2617, vol. 41, No. 10.

Zhang, L., et al., Heat-assisted magnetic probe recording on a granular CoNi/Pt multilayered film, Journal of Physics D: Applied Physics, 2006, pp. 2485-2487, vol. 39, IOP Publishing Ltd., UK.

U.S. Appl. No. 12/106,363, filed Apr. 21, 2008, Inventors: Xi et al.
U.S. Appl. No. 12/125,975, filed May 23, 2008, Inventors: Xi et al.
U.S. Appl. No. 12/239,887, filed Sep. 29, 2008, Inventors: Zheng et al.

U.S. Appl. No. 12/242,254, filed Sep. 30, 2008, Inventors: Zheng et al.
U.S. Appl. No. 12/248,237, filed Oct. 9, 2008, Inventor: Zhu.
U.S. Appl. No. 12/389,422, filed Feb. 20, 2009, Inventors: Ahn et al.
U.S. Appl. No. 12/396,868, filed Mar. 3, 2009; Inventors: Zheng.
U.S. Appl. No. 12/425,457, filed Apr. 17, 2009, Inventors: Gao et al.
U.S. Appl. No. 12/425,466, filed Apr. 17, 2009, Inventors: Lou et al.
Zheng, et al., Multilevel Magnetic Resistive Random Access Memory Written at Curie Point, Intermag Europe 2002, BB-02.
Zheng, Y. et al., Magnetic Random Access Memory (MRAM), J. Nano. Sci. Nano Tec. 7, 177-137 (2007).

* cited by examiner

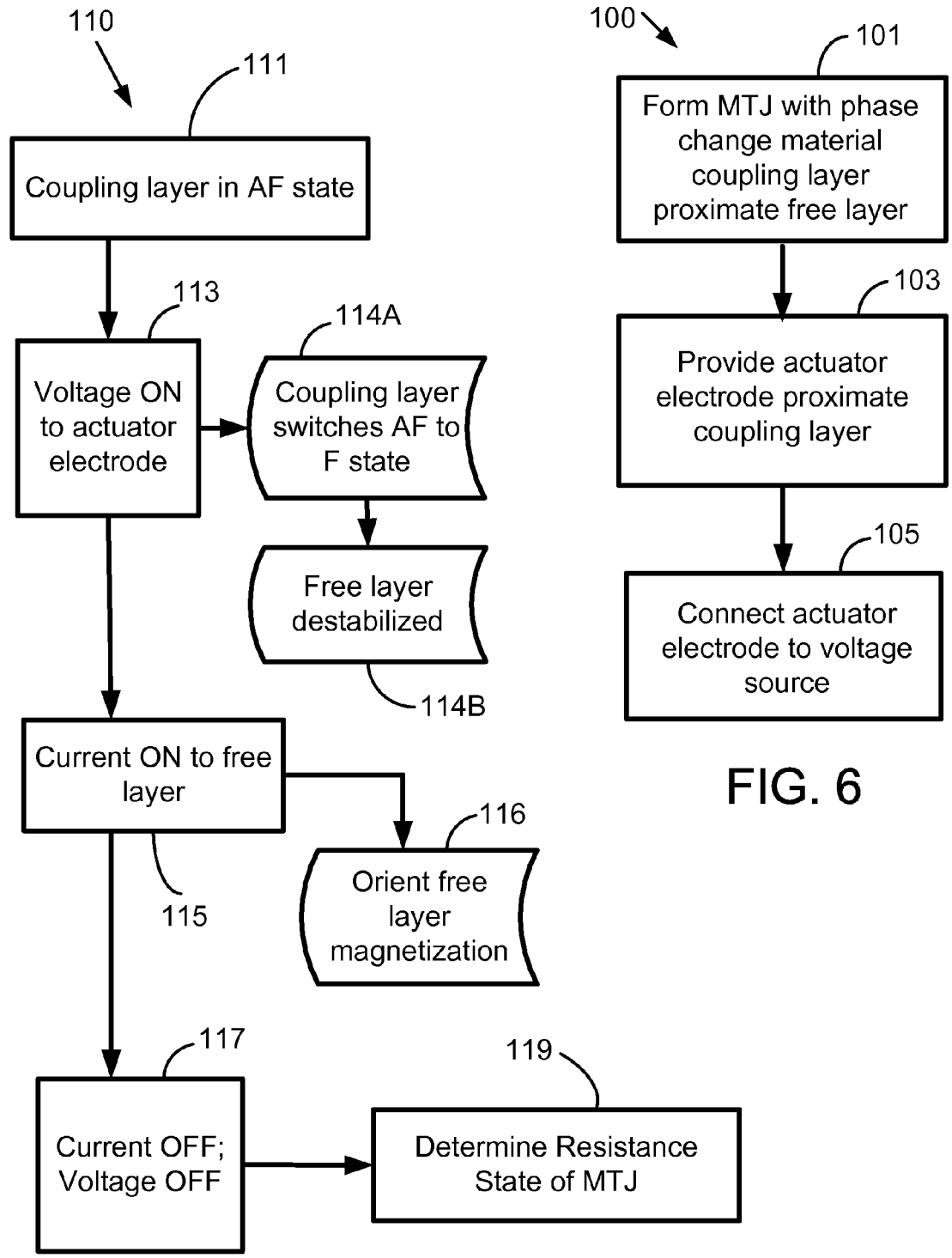

MAGNETIC MEMORY WITH STRAIN-ASSISTED EXCHANGE COUPLING SWITCH

RELATED APPLICATIONS

This application claims priority to U.S. provisional patent application No. 61/086,873, filed Aug. 7, 2008. The entire disclosure of application No. 61/086,873 is incorporated herein by reference.

BACKGROUND

Spin torque transfer technology, also referred to as spin electronics, combines semiconductor technology and magnetics, and is a more recent development. In spin electronics, the spin of an electron, rather than the charge, is used to indicate the presence of digital information. The digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer and a ferromagnetic free layer, each having a magnetization orientation that defines the resistance of the overall magnetic element. Such an element is generally referred to as a "spin tunneling junction," "magnetic tunnel junction", "magnetic tunnel junction cell", and the like. When the magnetization orientations of the free layer and pinned layer are parallel, the resistance of the element is low. When the magnetization orientations of the free layer and the pinned layer are antiparallel, the resistance of the element is high.

Application of spin torque transfer memory has a switching current density requirement generally at $10^6$ to $10^7$ A/cm$^2$, which leads to difficulty in integrating with a regular CMOS process. It is desirable to reduce the switching current density significantly in order to make a feasible product.

Various bilayer heat-assisted media designs have been proposed that attempt to lower the coercivity of the bilayer media and reduce the switching field. However, there are major difficulties in implementing these types of assisted switching. First, the reliability of the spin torque memory is a concern when heat assistance is utilized, due to the heat generated during switching; the assist temperature has the potential to thermally degrade the magnetic layers of the spin torque memory. This high transition temperature may have adverse thermal effects to the memory system, as the high power consumption needed during write cycles produces large amounts of heat that need to be dissipated.

Other designs of assisted switching are needed.

BRIEF SUMMARY

The present disclosure relates to magnetic tunnel junction cells that utilize spin torque and a strain induced by a phase change to assist in the switching of the magnetization orientation of the free layer of the magnetic tunnel junction cell. The magnetic memory unit, which includes the magnetic tunnel junction cell, can be utilized in a memory array.

In one particular embodiment, this disclosure describes a magnetic tunnel junction cell comprising a first ferromagnetic pinned layer, a ferromagnetic free layer, and a non-magnetic barrier layer therebetween. The first pinned layer and the free layer each have an out-of-plane magnetization orientation. The cell includes a second ferromagnetic pinned layer and a coupling layer between the second pinned layer and the free layer. The coupling layer comprises a phase change material switchable from an antiferromagnetic state to a ferromagnetic state.

In another particular embodiment, this disclosure describes a memory device comprising a magnetic tunnel junction cell including a coupling layer between a second pinned layer and the free layer, the coupling layer comprising a phase change material switchable from an antiferromagnetic state to a ferromagnetic state. The memory devices includes a first electrode and a second electrode electrically connected to the magnetic tunnel junction cell to pass a spin current therethrough, at least one actuator electrode proximate the coupling layer, and a voltage source electrically connected to the at least one actuator electrode.

In yet another particular embodiment, this disclosure describes a method of switching a memory device. The method includes switching a coupling layer in a magnetic tunnel junction cell from its antiferromagnetic state to its ferromagnetic state by applying a voltage to an actuator electrode and creating a strain in the actuator electrode, applying a spin current to orient a magnetization of the free layer to provide a low or high resistance state, and after orienting the magnetization of the free layer, removing the voltage and the spin current.

Additional embodiments of magnetic tunnel junction cells and memory devices are disclosed, as well methods of making and using the cells. These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 6 is a flow chart of a method for forming a magnetic tunnel junction cell, such as the cell of FIG. 2; and FIG. 7 is a flow chart of a method for using a memory device, such as the memory device of FIG. 3.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

This disclosure is directed to spin-transfer torque memory, also referred to as spin torque memory, spin torque RAM, or STRAM, and the magnetic tunnel junction cells (MTJs) that are a part of the memory. The spin magnetic tunnel junction cells (MTJs) of this disclosure utilize a mechanical strain to assist in the switching of the magnetization orientation of the free layer of the magnetic tunnel junction cell. Nano-mechanical tensile stress is applied to a phase-change material layer within the magnetic tunnel junction cell to increase the lattice parameters to activate the phase change and orient the layer magnetization.

In the following description, reference is made to the accompanying set of drawings that forms a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions and descriptions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

While the present disclosure is not so limited, an appreciation of various aspects of the disclosure and of the invention will be gained through a discussion of the Figures and the examples provided below.

Figure 1:
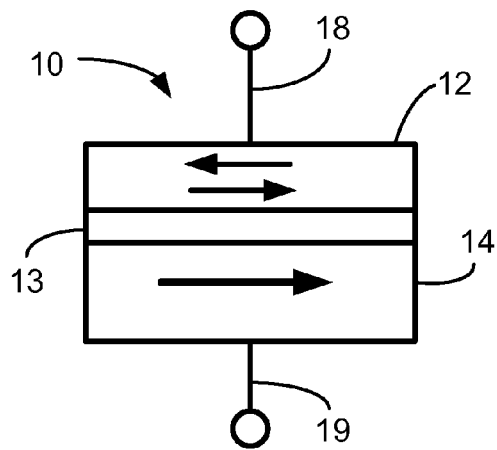
FIG. 1 is a cross-sectional schematic diagram of an illustrative magnetic tunnel junction cell with in-plane magnetization orientation.

FIG. 1 is a cross-sectional schematic diagram of a magnetic tunnel junction cell 10 that includes a soft ferromagnetic free layer 12 and a ferromagnetic reference (i.e., pinned) layer 14. Ferromagnetic free layer 12 and ferromagnetic pinned layer 14 are separated by an oxide barrier layer 13 or non-magnetic tunnel barrier. Note that other layers, such as seed or capping layers, are not depicted for clarity.

Ferromagnetic layers 12, 14 may be made of any useful ferromagnetic (FM) material such as, for example, Fe, Co or Ni and alloys thereof, such as NiFe and CoFe. Ternary alloys, such as CoFeB, may be particularly useful because of their lower moment and high polarization ratio, which are desirable for the spin-current switch. Either or both of free layer 12 and pinned layer 14 may be either a single layer or a synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization. The magnetization orientation of ferromagnetic free layer 12 is more readily switchable than the magnetization orientation of ferromagnetic pinned layer 14. Barrier layer 13 may be made of an electrically insulating material such as, for example an oxide material (e.g., $Al_2O_3$, $TiO_x$ or MgO). Other suitable materials may also be used. Barrier layer 13 could optionally be patterned with free layer 12 or with pinned layer 14, depending on process feasibility and device reliability.

The following are various specific examples of magnetic tunnel junction cells 10. In some embodiments of magnetic tunnel junction cell 10, oxide barrier layer 13 includes $Ta_2O_5$ (for example, at a thickness of about 0.5 to 1 nanometer) and ferromagnetic free layer 12 and a ferromagnetic pinned layer 14 include NiFe, CoFe, or Co. In other embodiments of magnetic tunnel junction cell 10, barrier layer 13 includes GaAs (for example, at a thickness of about 5 to 15 nanometers) and ferromagnetic free layer 12 and ferromagnetic pinned layer 14 include Fe. In yet other embodiments of magnetic tunnel junction cell 10, barrier layer 13 includes $Al_2O_3$ (for example, a few (e.g., about 1-5) nanometers thick) and ferromagnetic free layer 12 and ferromagnetic pinned layer 14 include NiFe, CoFe, or Co.

A first electrode 18 is in electrical contact with ferromagnetic free layer 12 and a second electrode 19 is in electrical contact with ferromagnetic pinned layer 14. Electrodes 18, 19 electrically connect ferromagnetic layers 12, 14 to a control circuit providing read and write currents through layers 12, 14. The resistance across magnetic tunnel junction cell 10 is determined by the relative orientation of the magnetization vectors or magnetization orientations of ferromagnetic layers 12, 14. The magnetization direction of ferromagnetic pinned layer 14 is pinned in a predetermined direction while the magnetization direction of ferromagnetic free layer 12 is free to rotate under the influence of spin torque. Pinning of ferromagnetic pinned layer 14 may be achieved through, e.g., the use of exchange bias with an antiferromagnetically ordered material such as PtMn, IrMn, and others.

In some embodiments, magnetic tunnel junction cell 10 is in the low resistance state where the magnetization orientation of ferromagnetic free layer 12 is parallel and in the same direction of the magnetization orientation of ferromagnetic pinned layer 14. This is termed the low resistance state or "0" data state. In other embodiments, magnetic tunnel junction cell 10 is in the high resistance state where the magnetization orientation of ferromagnetic free layer 12 is anti-parallel and in the opposite direction of the magnetization orientation of ferromagnetic pinned layer 14. This is termed the high resistance state or "1" data state.

Switching the resistance state and hence the data state of magnetic tunnel junction cell 10 via spin-transfer occurs when a current, passing through a magnetic layer of magnetic tunnel junction cell 10, becomes spin polarized and imparts a spin torque on free layer 12 of magnetic tunnel junction cell 10. When a sufficient spin torque is applied to free layer 12, the magnetization orientation of free layer 12 can be switched between two opposite directions and accordingly, magnetic tunnel junction cell 10 can be switched between the parallel state (i.e., low resistance state or "0" data state) and anti-parallel state (i.e., high resistance state or "1" data state).

Free layer 12 is where data or bit information is stored when the device operates under "read", or overwritten when the device operates under "write". Each ferromagnetic layer 12, 14 acts as "spin filter" when cell 10 writes with "0" or "1" as the switching current passes through in opposite directions to alter magnetization of free layer 12.

Figure 1A:
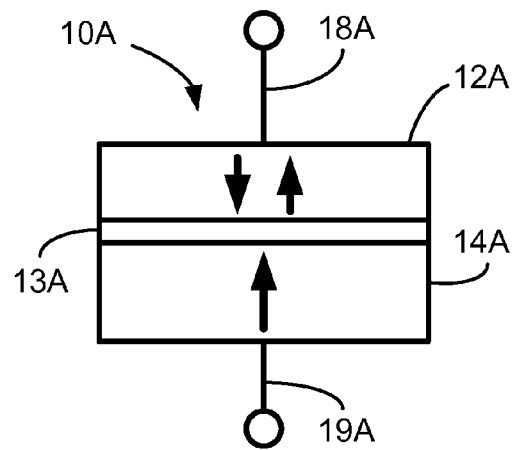
FIG. 1A is a cross-sectional schematic diagram of an illustrative perpendicular anisotropy magnetic tunnel junction cell with out-of-plane magnetization orientation.

The magnetization orientations of free layer 12 and pinned layer 14 of magnetic tunnel junction cell 10 are in the plane of the layers, or in-plane. FIG. 1A illustrates an alternate embodiment of a magnetic tunnel junction cell that has the magnetization orientations of the free layer and the pinned layer perpendicular to the plane of the layers, or out-of-plane.

Similar to magnetic tunnel junction cell 10 of FIG. 1, magnetic tunnel junction cell 10A of FIG. 1A has soft ferromagnetic free layer 12A and a ferromagnetic reference (i.e., pinned) layer 14A separated by an oxide barrier layer 13A or non-magnetic tunnel barrier. A first electrode 18A is in electrical contact with ferromagnetic free layer 12A and a second electrode 19A is in electrical contact with ferromagnetic pinned layer 14A. Other layers, such as seed or capping layers, are not depicted for clarity. Electrodes 18A, 19A electrically connect ferromagnetic layers 12A, 14A to a control circuit providing read and write currents through layers 12A, 14A. The various elements of cell 10A are similar to the element of cell 10, described above, except that the magnetization orientations of layers 12A, 14A are oriented perpendicular to the layer extension rather than in the layer plane.

Free layer 12A and pinned layer 14A each have a magnetization orientation associated therewith, illustrated in FIG. 1A. In some embodiments, magnetic tunnel junction cell 10A is in the low resistance state or "0" data state where the magnetization orientation of free layer 12A is in the same direction of the magnetization orientation of pinned layer 14A. In other embodiments, magnetic tunnel junction cell 10A is in the high resistance state or "1" data state where the magnetization orientation of free layer 12A is in the opposite direction of the magnetization orientation of pinned layer 14A.

Similar to cell 10 of FIG. 1, switching the resistance state and hence the data state of magnetic tunnel junction cell 10A via spin-transfer occurs when a current, passing through a magnetic layer of magnetic tunnel junction cell 10A, becomes spin polarized and imparts a spin torque on free layer 12A. When a sufficient spin torque is applied to free layer 12A, the magnetization orientation of free layer 12A can be switched between two opposite directions and accordingly, magnetic tunnel junction cell 10A can be switched between the low resistance state or "0" data state and the high resistance state or "1" data state.

In accordance with this disclosure, the switching of the free layer magnetization orientation is facilitated by a coupling layer proximate the free layer. The coupling layer has a phase change material, which, upon its phase change, destabilizes the free layer and reduces the switching current needed. The phase change material of the coupling layer is incited to phase change by mechanical stress or strain.

Figure 2:
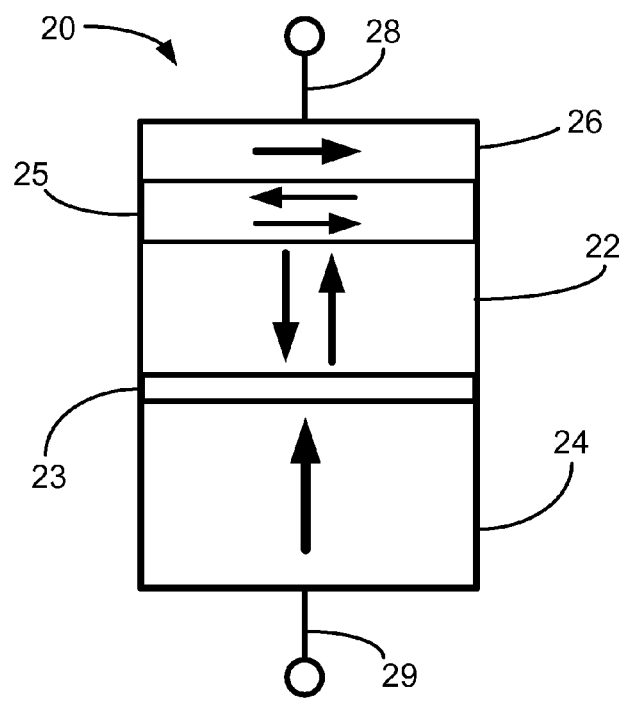
FIG. 2 is a cross-sectional schematic diagram of a perpendicular anisotropy magnetic tunnel junction cell having a stress-assisted switch with the switch in the "off" state.

A perpendicular magnetic tunnel junction cell structure that incorporates a strain-assisted coupling layer is illustrated in FIG. 2 as magnetic tunnel junction cell 20. Magnetic tunnel junction cell 20 includes a soft perpendicular ferromagnetic free layer 22 and a perpendicular ferromagnetic reference (i.e., pinned) layer 24. Ferromagnetic free layer 22 and ferromagnetic pinned layer 24 are separated by an oxide barrier layer 23 or non-magnetic tunnel barrier. The magnetization orientation of layer 22, 24 is perpendicular to the layer, or, out-of-plane. Non-limiting examples of suitable materials for these layers include: for free layer 22, a thin layer (e.g., about 2-30 nm) of Co/Pt multilayers or FePt alloys or CoFe/Pt or CoFeX where X is a rare-earth transition metal such as Tb or Gd; for pinned layer 24, a thick layer (e.g., about 5-50 nm) of Co/Pt multilayers or FePt alloys or CoFePt or CoFeX; for barrier 23, insulating material (e.g., about 10-30 Angstroms) such as $Al_2O_3$ or MgO. Alternately, free layer 22, pinned layer 24 and barrier layer 23 could be any of the materials described above in relation to free layer 12, 12A, pinned layer 14, 14A or barrier layer 13, 13A.

Unlike magnetic tunnel junction cells 10, 10A of FIGS. 1 and 1A, magnetic tunnel junction cell 20 also includes a second ferromagnetic pinned layer 26 and a phase change material coupling layer 25 positioned between free layer 22 and second pinned layer 26. Coupling layer 25 may be adjacent to one or both of free layer 22 and pinned layer 26 or may have an intermediate layer therebetween. Second pinned layer 26 can have properties similar to pinned layer 24, or any of the properties or characteristics discussed above in relation to pinned layer 14 of cell 10 or pinned layer 14A of cell 10A. In some embodiments, second pinned layer 26 and coupling layer 25 have magnetization orientations that are in the plane of the layers, or, in-plane. Coupling layer 25 is formed of a phase change material, which changes a physical property upon an activating incident, such as being exposed to a voltage. Coupling layer 25 may be formed from an antiferromagnetic or superparamagnetic phase transition material that can change to a ferromagnetic material upon an activating incident. A non-limiting example of a suitable phase change material that transitions from magnetic to antimagnetic and back is FeRh and ternary alloys thereof, such as FeRhIr and FeRhPt. Second pinned layer 26 provides directional pinning of coupling layer 25 when coupling layer 25 is in its magnetic state.

Magnetic tunnel junction cell 20 has a first electrode 28 in electrical contact with second ferromagnetic pinned layer 26 and a second electrode 29 in electrical contact with ferromagnetic pinned layer 24. Electrodes 28, 29 are formed of an electrically conducting material, typically metal. An example of a suitable metal for electrodes 28, 29 is Pt. Electrodes 28, 29 electrically connect ferromagnetic layers 22, 24, 26 and coupling layer 25 to a control circuit.

Figure 3:
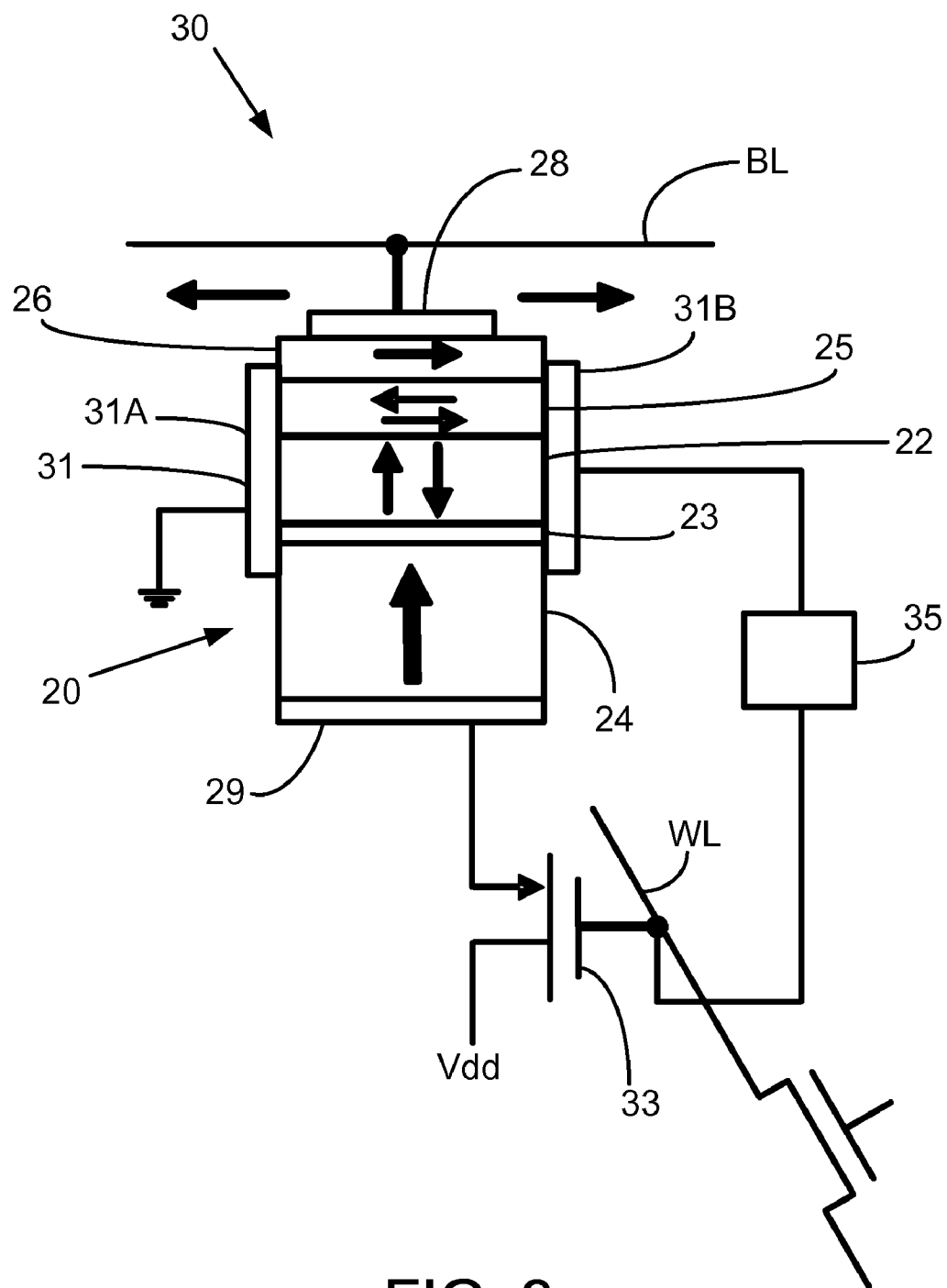
FIG. 3 is a schematic diagram of a memory device including the magnetic tunnel junction cell of FIG. 2.

The illustrative spin-transfer torque magnetic tunnel junction cell 20 may be used to construct a memory device where a data bit is stored in the magnetic tunnel junction cell by the relative magnetization state of free layer 22 with respect to pinned layer 24. The stored data bit can be read out by measuring the resistance of cell 20 which changes with the magnetization direction of free layer 22 relative to pinned layer 24. FIG. 3 illustrates magnetic tunnel junction cell 20 incorporated into a memory device 30 with a transistor and control circuit.

Tunnel junction cell 20, having free layer 22, barrier 23, pinned layers 24, 26 and coupling layer 25, is connected to bit line BL via electrode 28 and to word line WL via electrode 29 and transistor 33.

Proximate tunnel junction cell 20 is at least one actuator electrode 31, in this embodiment, first and second actuator electrodes 31A, 31B. Electrode 31, e.g., actuator electrodes 31A, 31B, is present proximate at least coupling layer 25 and optionally proximate one or more of free layer 22, pinned layer 24, and second pinned layer 26. Electrode(s) 31 may be formed of a piezoelectric material or a magnetoelectric material. An example of a suitable piezoelectric material for electrode(s) 31 is lead zirconate titanate (PbZrTiO). Actuator electrode(s) 31 are connected to receive a voltage therethrough, for example, from a timing circuit control 35. The voltage through electrode(s) 31 may be coincident with write voltage passed through cell 20 to write or switch free layer 22.

Actuator electrode(s) 31 initiate stress and strain that is relayed or transferred to coupling layer 25. For example, as voltage is applied to electrode(s) 31, the voltage induces a nano-mechanical strain in electrode(s) 31 which transfers to the proximate coupling layer 25. This strain on the phase change material of coupling layer 25 increases the lattice parameters of the material to activate a switch change from its antiferromagnetic (AF) state to ferromagnetic (F) state in the applied stress direction.

Using FeRh as an example phase change material for coupling layer 25, the AF-F state transition occurs when the FeRh lattice constant changes (under increasing temperature) about 0.3%-0.5%. With FeRh having a Young's modulus $\epsilon_{FeRh}=1.7\times10^{11}$ Pa, only approximately a few volts or less are needed to generate the 0.3%-0.5% strain level. At such a voltage level, the actuation voltage source can be shared with the address signal to synchronize the "write" or switching event through a simple RC delay circuitry; such as timing circuit control 35.

Spin torque switching current requirement on a device with perpendicular anisotropy magnetic layers, such as magnetic tunnel junction cell 10A of FIG. 1A, is:

$$I_d = \frac{\alpha e M_s V}{\hbar g}[H_k - H_{\mathit{eff}}]$$

$$H_{\mathit{eff}} = H_{ex} + H + 4\pi M_s$$

where $M_s$ and $H_k$ are respectively magnetization and anisotropy field of the free layer, and H is the perpendicular field. When the out-of-plane field is at zero, H=0 and the required threshold switching current is:

$$I_d = \frac{\alpha e M_s V}{\hbar g}[H_k - 4\pi M_s]$$

When there is no stress applied ($H_{ex}=0$), the switch signal is "OFF". The $H_{\mathit{eff}}$ needed to overcome the anisotropy field minus demagnetization field is usually in the order of 10 KOe. However, in the design of this disclosure, such as magnetic tunnel junction cell 20, $H_{\mathit{eff}}$ also includes the exchange field from the phase change material (e.g., FeRh) in the ferromagnetic state. $H_{ex}$ is thus determined by:

$$H_{ex} \frac{\sigma}{M_s \delta_{SL}} = \frac{2\sqrt{AK}}{M_s \delta_{SL}}$$

where $\delta_{SL}$ is the free layer thickness of free layer 22, A is the interlayer exchange constant and K is the anisotropy constant. With the horizontal exchange field $H_{ex}$ in the phase change material coupling layer 25 generated from the strain applied to it, the required switching field $H_{\mathit{eff}}$ (with the presence of the exchange field from the phase change material) can be reduced down to 10% of $H_{\mathit{eff}}$ (without the phase change material). Therefore, the switching current for magnetic tunnel junction cell 20 will be approximately only 10% of the switching current for magnetic tunnel junction cell 10A.

Although only 10% of the current is needed to switch free layer 22 of cell 20 as compared to free layer 12A of cell 10A, a voltage is needed for actuator electrode(s) 31 to induce the magnetic phase transition of coupling layer 25. The voltage is determined by:

$$V = \frac{\Delta L \varepsilon D S^E_{33}}{L d_{33}} = \sigma \frac{\varepsilon D S^E_{33}}{d_{33}}$$

Applying the following parameters, $\Delta L/L=0.5\%$, D=50 nm, $S_{33}=23\times10^{-12}$ m$^2$/N, $d_{33}=220\times10^{-12}$ C/m (which is standard for a sol-gel PZT material), and $\epsilon=1.8\times10^{11}$ Nm$^{-2}$, the resulting voltage is V=4.7 V.

Based on at least the discussion above and the theory behind it, a design such as memory device 30, with magnetic tunnel junction cell 20 having a phase change coupling layer 25 and actuator electrode(s) 31, has numerous design advantages over memory devices that have a conventional magnetic tunnel junction cell or that have a magnetic tunnel junction cell that utilizes other methods to facilitate switching of the free layer. The switching current in needed to switch the free layer (unstabilized by the coupling layer) is less than about 10% of that needed when no free layer instability is present. Additionally, other advantages exist. For example, by using a coupling layer that has a phase change that is strain activated, there is no need to heat the coupling layer or the free layer, so that the design is more thermally reliable than other designs. Because the AF-F switching is based on an applied voltage, the AF-F switch and the subsequent free layer switching can be precisely controlled. This AF-F switching is fast and efficient, with the transition from AF-F and from F-AF being in the range of femto seconds, with no hysteresis.

Figure 4:
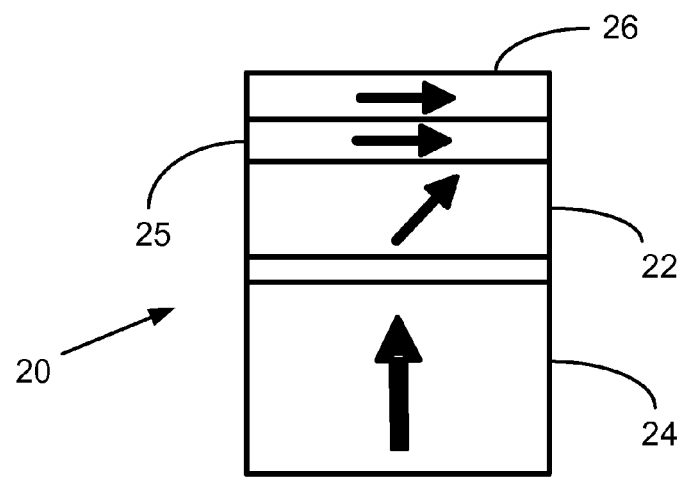
FIG. 4 is a cross-sectional schematic diagram of the magnetic tunnel junction cell of FIG. 2 with a stress being applied to change the phase-change material from its antiferromagnetic state to its ferromagnetic state.
Figures 5A, 5B:
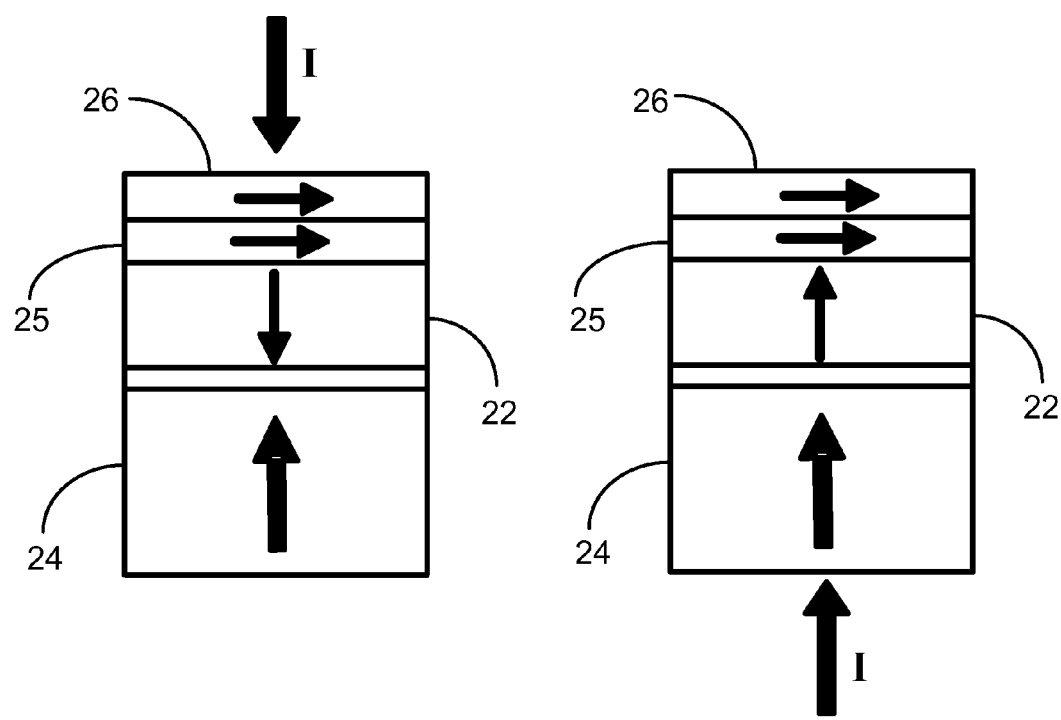
FIG. 5A is a cross-sectional schematic diagram of the magnetic tunnel junction cell of FIG. 2 with a switching current applied in a first direction thereto.
FIG. 5B is a cross-sectional schematic diagram of the magnetic tunnel junction cell of FIG. 2 with a switching current applied in a second direction thereto.

Referring again to the figures, particularly to FIG. 2 and to FIGS. 4 and 5A and 5B, the operation mechanism of cell 20, in particular the switching process of the magnetization orientation of free layer 22 is a 2-step process.

As illustrated in FIG. 2, the phase change material of coupling layer 25 is initially in its antiferromagnetic state, with an undefined magnetization orientation in relation to second pinned layer 26. Both pinned layer 24 and free layer 22 have a perpendicular or out-of-plane magnetization orientation, with the magnetization of free layer 22 being undefined as to orientation (e.g., either the same or opposite direction and the magnetization orientation of pinned layer 24). An interface exists between free layer 22 and coupling layer 25. Free layer 22 has a thermal stability of about $K_u V=0.5 M_s V(H_k-4\pi M_s)$ where Ku is the anisotropy constant.

To define the data state of cell 20, either as a "0" with the magnetization orientations of free layer 22 and pinned layer 24 in the same direction, or as a "1" with the magnetization orientations of free layer 22 and pinned layer 24 in the opposite directions, the voltage to actuator electrode(s) 31 (in FIG. 3) is switched "ON". The voltage in electrode(s) 31 causes a stress or strain in electrode(s) 31, which is applied to coupling layer 25. The stress on coupling layer 25 causes the phase change material to switch from its antiferromagnetic (AF) stage to its ferromagnetic (F) state and orient itself with the magnetization orientation of second pinning layer 26, illustrated in FIG. 4. The exchange field between free layer 22 and coupling layer 25 reduces the stability of free layer 22; the instability in free layer 22 shown in FIG. 4.

In FIG. 5A, with free layer 22 destabilized, spin current I is passed through magnetic tunnel junction cell 20 via electrodes 28, 29 (FIG. 2) in the direction from free layer 22 to pinned layer 24. This results in an orientation of the magnetization of free layer 22 with the current, but opposite to the magnetization orientation of pinned layer 24, writing the data state "1". The spin current is removed, as is the voltage to electrode(s) 31. The resulting free layer stability is restored to the original thermal stability, approximately $0.5 M_s V(H_k-47\pi M_s)$, and the resulting magnetization orientation is retained.

In FIG. 5B, with free layer 22 destabilized due to voltage on electrode(s) 31, spin current I is passed through magnetic tunnel junction cell 20 via electrodes 28, 29 (FIG. 2) in the direction from pinned layer 24 to free layer 22. This results in an orientation of the magnetization of free layer 22 with the current and with the magnetization orientation of pinned layer 24, writing the data state "0". The spin current is removed, as is the voltage to electrode(s) 31. The resulting free layer stability is restored to its original thermal stability, approximately $0.5 M_s V(H_k - 47 \pi M_s)$, and the resulting magnetization orientation is retained.

The magnetic tunnel junction cell (e.g., cell 20) and memory structures (e.g., memory device 30) of this disclosure may be made by well-known thin film building and removal techniques such as chemical vapor deposition (CVD), physical vapor deposition (PVD), atomic layer deposition (ALD), photolithography, dry etching, wet etching, or ion milling. The magnetization orientations of the pinned layer(s) (e.g., layers 24, 26) may be set immediately after forming the pinned layer or after forming subsequent layer(s). The actuator electrode(s) may be formed using well-known thin film techniques or may be previously formed and connected to the cell.

FIG. 6 illustrates stepwise a method for making magnetic tunnel junction 20 or other magnetic tunnel junction cell that utilizes a mechanical strain to assist in the switching of the magnetization orientation of the free layer. Method 100 includes Step 101 of forming a magnetic tunnel junction having a phase change coupling layer proximate the free layer (e.g., forming cell 20 having coupling layer 25 proximate free layer 22). Step 103 of the method includes providing at least one actuator electrode proximate at least the coupling layer (e.g., providing actuator electrode(s) 31 proximate at least coupling layer 25). In Step 105, the actuator electrode(s) are electrically connected to a voltage source to apply voltage through the electrodes.

FIG. 7 illustrates stepwise a method for writing a data state to magnetic tunnel junction cell 20 or other magnetic tunnel junction cell that utilizes a mechanical strain to assist in the switching of the magnetization orientation of the free layer. Nano-mechanical tensile stress is applied to a phase-change material layer within the magnetic tunnel junction cell to increase the lattice parameters to activate the phase change and orient the layer magnetization.

Method 110 includes starting at 111 with a magnetic tunnel junction cell (e.g., cell 20) with its phase change coupling layer (e.g., coupling layer 25) in the antiferromagnetic state. In step 113, the voltage to actuator electrode(s) (e.g., electrode(s) 31 in FIG. 3) is switched ON. This causes a stress or strain in the electrode(s), which is applied to the phase change coupling layer (e.g., coupling layer 25). The stress on the coupling layer causes the phase change material to switch from its antiferromagnetic (AF) stage to its ferromagnetic (F) state, in Step 114A. The exchange field between the coupling layer and the proximate free layer (e.g., free layer 22) reduces the stability of the free layer facilitating orienting the magnetization of that layer; Step 114B. In Step 115, spin current is turned ON and passed through the magnetic tunnel junction cell (e.g., cell 20). This current orients the free layer magnetization (Step 116) to either the same direction or the opposite direction as of the corresponding pinned layer (e.g., pinned layer 24). In Step 117, the spin current is turned OFF, and the voltage to the electrode(s) is turned OFF. The resistance state of the magnetic tunnel junction cell is determined in Step 119; the resistance state will be either "0" or "1".

Thus, embodiments of the MAGNETIC MEMORY WITH STRAIN-ASSISTED EXCHANGE COUPLING SWITCH are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic tunnel junction cell comprising:
   a first ferromagnetic pinned layer, a ferromagnetic free layer, and a non-magnetic barrier layer therebetween, the first pinned layer and the free layer each having an out-of-plane magnetization orientation,
   a second ferromagnetic pinned layer and a coupling layer between the second pinned layer and the free layer, the coupling layer comprising a phase change material switchable between an antiferromagnetic state to a ferromagnetic state.

2. The magnetic tunnel junction cell of claim 1, wherein the second pinned layer has an in-plane magnetization orientation.

3. The magnetic tunnel junction cell of claim 2, wherein the coupling layer comprises FeRh.

4. The magnetic tunnel junction cell of claim 2, wherein the coupling layer is adjacent to both the free layer and the second pinned layer.

5. The magnetic tunnel junction cell of claim 2 further comprising a first electrode and a second electrode electrically connected to pass a current through at least the free layer and the first pinned layer.

6. The magnetic tunnel junction cell of claim 2 further comprising at least one actuator electrode proximate the coupling layer.

7. The magnetic tunnel junction cell of claim 6 wherein the at least one actuator electrode is also proximate at least one of the free layer, the first pinned layer or the second pinned layer.

8. The magnetic tunnel junction cell of claim 6 wherein the at least one actuator electrode comprises a piezoelectric material.

9. The magnetic tunnel junction cell of claim 8 wherein the piezoelectric material comprises lead zirconate titanate.

10. The magnetic tunnel junction of claim 6 comprising a first actuator electrode and a second actuator electrode.

11. A memory device comprising:
   a magnetic tunnel junction cell comprising a first ferromagnetic pinned layer, a ferromagnetic free layer, and a non-magnetic barrier layer therebetween, the first pinned layer and the free layer each having an out-of-plane magnetization orientation, the magnetic tunnel junction cell further comprising a second ferromagnetic pinned layer and a coupling layer between the second pinned layer and the free layer, the coupling layer comprising a phase change material switchable between an antiferromagnetic state to a ferromagnetic state;
   a first electrode and a second electrode electrically connected to the magnetic tunnel junction cell to pass a current therethrough;
   at least one actuator electrode proximate the coupling layer; and
   a voltage source electrically connected to the at least one actuator electrode.

12. The memory device of claim 11 wherein the voltage source, when activated, induces a nano-mechanical strain in the at least one actuator electrode.

13. The memory device of claim 11 further comprising a timing circuit operably connected to the voltage source.

14. The memory device of claim 11 wherein a write voltage passed through the first and second electrodes is coincident with a voltage through the at least one actuator electrode.

15. The memory device of claim 11 further comprising a word line and a bit line connected to the first electrode and the second electrode.

16. A method of switching a memory device, the method comprising:
  providing a magnetic tunnel junction cell having a free layer, a first pinned layer, a nonmagnetic barrier therebetween, a phase change coupling layer between the free layer and a second pinned layer, and an actuator electrode proximate the coupling layer;
  switching the coupling layer from the antiferromagnetic state to the ferromagnetic state by applying a voltage to the actuator electrode and creating a strain in the actuator electrode;
  applying a spin current to orient a magnetization of the free layer to provide a low or a high resistance state; and
  after orienting the magnetization of the free layer, removing the voltage and the spin current.

17. The method of claim 16, wherein switching the coupling layer from an antiferromagnetic state to a ferromagnetic state results in reducing the stability of the free layer.

18. The method of claim 17 wherein orienting the magnetization of the free layer to provide a high resistance state comprises orienting the magnetization of the free layer opposite a magnetization orientation of the first pinned layer to provide a "1" resistance state.

19. The method of claim 17 wherein orienting the magnetization of the free layer to provide a low resistance state comprises orienting the magnetization of the free layer same as a magnetization orientation of the first pinned layer to provide a "0" resistance state.

20. The method of claim 17 further comprising reading the memory device by determining the resistance state of the magnetic tunnel junction cell.

21. A magnetic element comprising:
  a first ferromagnetic pinned layer, a ferromagnetic free layer, and a non-magnetic barrier layer therebetween, the first pinned layer and the free layer each having an out-of-plane magnetization orientation,
  a second ferromagnetic pinned layer and a coupling layer between the second pinned layer and the free layer, the coupling layer comprising a phase change material switchable between an antiferromagnetic state to a ferromagnetic state.

22. The magnetic element of claim 21, wherein the second pinned layer has an in-plane magnetization orientation.

23. The magnetic element of claim 22, wherein the coupling layer comprises FeRh.

24. The magnetic element of claim 22, wherein the coupling layer is adjacent to both the free layer and the second pinned layer.

* * * * *